United States Patent
Iwaki et al.

(10) Patent No.: US 6,404,254 B2
(45) Date of Patent: *Jun. 11, 2002

(54) LATCH CIRCUIT AND SEMICONDUCTOR INTEGRATED CIRCUIT HAVING THE LATCH CIRCUIT WITH CONTROL SIGNAL HAVING A LARGE VOLTAGE AMPLITUDE

(75) Inventors: Hiroaki Iwaki; Kouichi Kumagai; Susumu Kurosawa, all of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/166,585

(22) Filed: Oct. 6, 1998

(30) Foreign Application Priority Data

Oct. 6, 1997 (JP) ............................................. 9-272287

(51) Int. Cl.⁷ ............................................... H03K 3/286
(52) U.S. Cl. ...................... 327/214; 327/225; 327/544; 365/229
(58) Field of Search .................................. 327/185, 197, 327/199, 200–206, 213, 225, 214–219, 538, 544, 57, 530, 546; 365/189.05, 205, 230.06, 227–229, 230.08, 154–156

(56) References Cited

U.S. PATENT DOCUMENTS

| 5,486,774 A | 1/1996 | Douseki et al. ................ 326/33 |
| 5,583,457 A | 12/1996 | Horiguchi et al. ........... 326/121 |
| 5,812,463 A * | 9/1998 | Park ....................... 365/189.05 |
| 5,877,651 A * | 3/1999 | Furutani ...................... 327/538 |

FOREIGN PATENT DOCUMENTS

JP    6-29834    2/1994

OTHER PUBLICATIONS

Shigematsu et al., "A 1-V high-speed MTCMOS circuit scheme for power-down applications", 1995, pp. 125–126.

* cited by examiner

Primary Examiner—Toan Tran
Assistant Examiner—Minh Nguyen
(74) Attorney, Agent, or Firm—McGinn & Gibb, PLLC

(57) ABSTRACT

A semiconductor integrated circuit so configured to stop the supplying of an electric power to a logic circuit in a standby mode, thereby to realize a low power consumption, includes a latch circuit characterized in that as the control signal a clock signal is supplied in the active mode, and a signal for creating an information hold condition is supplied in the standby mode, and in that MOSFETs applied with a control signal include a first conductivity type MOSFET having a high threshold and a second conductivity type MOSFET having a low threshold, a voltage amplitude of the control signal being larger than a power supply voltage. The semiconductor integrated circuit can be realized in that the high speed operation in the active mode and the low power consumption in the standby mode are compatible with each other, and it is sufficient if a power switch for the logic circuit is inserted at only either of the high level power supply voltage line side and the low level power supply voltage line side. In addition, the control signals are very few, and a fine timing control for changing over the mode is no longer required.

17 Claims, 9 Drawing Sheets

LATCH CIRCUIT AND SEMICONDUCTOR INTEGRATED CIRCUIT HAVING THE LATCH CIRCUIT WITH CONTROL SIGNAL HAVING A LARGE VOLTAGE AMPLITUDE

BACKGROUND OF THE INVENTION

1. Field of the Invention

The present invention relates to a semiconductor integrated circuit, and more specifically to a semiconductor integrated circuit which can reconcile a high speed operation in an active mode and a low power consumption in a standby mode.

2. Description of Related Art

Recently, a demand for a low power consumption is increasing around the field of a portable electronic information instrument, and to meet with this demand, a low power supply voltage for the LSI has been advanced. Here, in a circuit constituted of MOSFETs, if the power supply voltage expressed with VDD and a threshold of the MOSFET is expressed with VT, an operation speed of the circuit constituted of MOSFETs is in proportion to about $(VDD-VT)^2$. As a result, if the power supply voltage is greatly lowered, the operation speed abruptly drops. In other words, in order to reconcile a high speed operation in an active condition and a low power consumption in a standby condition, it is extremely difficult to greatly lower the power supply voltage.

On the other hand, in order to elevate the operation speed, if the threshold voltage VT is lowered, a subthreshold current which flows through the MOSFET in an OFF condition, increases, with the result that the power consumption in the standby condition in which the LSI does not operate, greatly increases. For example, if the threshold voltage is lowered by 0.1V, the subthreshold current flowing through the MOSFET of the OFF condition increases more than ten times.

In the field of the portable electronic information instrument, it is a matter of course that the high speed operation is required, but the power consumption in the standby condition is a large factor which determines the lift of the battery cell. Therefore, particularly in a region of the power supply voltage not greater than 2V, it is an important technical problem to be solved that the high speed operation and the low power consumption are compatible.

In order to make the high speed operation and the low power consumption compatible to each other, for example, Japanese Patent Application Pre-examination Publication No. JP-A-06-029834 (U.S. Pat. No. 5,484,774, the content of which is incorporated by reference in its entirety into this application) discloses a technology of setting the active mode and the standby mode and stopping the supplying of the electric power in the standby mode, thereby to realize the lower power consumption.

In the technology disclosed by the above referred publication, MOSFETs having two kinds of threshold are used, and therefore, this is called a "Multi-Threshold-CMOS technology" (abbreviated to "MTCMOS technology, and called a first prior art).

Now, the first prior art will be described with reference to FIG. 11. In the shown example, logic circuits 11a and 11b are constituted of MOSFETs having a low threshold voltage, and have power terminals connected to quasi-power line QL1 and QL2, respectively. The quasi-power line QL1 and QL2 are connected through power switches 101 and 102 to power supply lines PL1 and PL2, respectively.

The power switches 101 and 102 are MOSFETs having a high threshold voltage, and supplied with control signals CS and CSB so as to be turned on in the active mode and off in the standby mode. If the size of the power switches 101 and 102 is set to be sufficiently large, the potentials of the quasi-power line QL1 and QL2 can be made substantially equal to those of the power supply lines PL1 and PL2, respectively, in the active mode. As a result, the operation speed of the low threshold logic circuit is not almost deteriorated. In the standby mode, the power switches 101 and 102 are turned off, so that the supplying of the power is stopped, with the result that the low power consumption can be realized although the logic circuit is constituted of the low threshold MOSFETs.

Furthermore, the shown example includes an information hold circuit 11c, which is constituted of for example a latch circuit, which holds information in the standby mode. In this information hold circuit 11c, both of the high threshold MOSFETs and the low threshold MOSFETs are used. The low threshold MOSFETs are used in a circuit of determining the operation speed in the action condition, and power terminals of that circuit are connected to the quasi-power line QL1 and QL2, respectively. The high threshold MOSFETs are used in a circuit of holding the information in the standby condition, and power terminals of that circuit are connected to the power supply lines PL1 and PL2, respectively. With this arrangement, the power is supplied even in the standby mode, so that the information is held, and on the other hand, the low power consumption is realized.

In this MTCMOS technology, however, the design of the circuit for holding the information in the standby mode, is very important. Here, the latch circuit will be described as an example. FIG. 12 is one example of the latch circuit used in the prior art (not the MTCMOS technology). The shown latch circuit includes complementary pass transistors 103 and 104 having respective gate terminals receiving a pair of complementary clocks CK and CKB. Furthermore, the latch circuit includes inverter circuits 105 and 106, which are connected to power supply lines VCC and VSS, respectively. In this latch circuit, an input data is fetched by turning on the path transistors 103 and by turning off the path transistors 104, and the information is held by turning off the path transistors 103 and by turning on the path transistors 104.

FIG. 13 is one example of applying the latch circuit shown in FIG. 12 to the MTCMOS technology. The shown latch circuit includes complementary path transistors 111 and 112 having respective gate terminals receiving a pair of complementary clocks CK and CKB. A pair of power supply terminals of an inverter circuit 113 are connected through power switches 116 and 117 to the power supply lines PL1 and PL2, respectively. Gate terminals of these power switches 116 and 117 are supplied with the control signals CS and CSB, respectively, so that the power switches 116 and 117 are turned on in the active mode and are turned off in the standby mode. A pair of power supply terminals of inverter circuit 114 and 115 are connected to the power supply lines PL1 and PL2, respectively.

The path transistors 111 and the inverter circuit 113 are constituted of the low threshold MOSFETs, and the inverter circuits 114 and 115 and the power switches 116 and 117 are constituted of the high threshold MOSFETs. Incidentally, the path transistors 112 can be constituted of either the low threshold MOSFETs or the high threshold MOSFETs, and the data fetching operation and the data holding operation are similar to those of the prior art latch circuit shown in FIG. 12.

As mentioned above, since the path transistors 111 and the inverter circuit 113 are constituted of the low threshold MOSFETs, the high speed operation can be realized. In the standby mode, the path transistors 111 are turned off and the path transistors 112 are turned on so that the information is held in a loop composed of the path transistors 112 and the inverter circuits 114 and 115. As mentioned above, since the inverter circuits 114 and 115 are constituted of the high threshold MOSFETs, the low power consumption can be realized.

However, this latch circuit has a problem in which the power switches cannot be used in common to other circuits. Even in the standby mode, an input potential and an output potential of the inverter circuit 113 are fixed by the inverter circuits 114 and 115. Therefore, when the input potential is at a low level, an internal node 118 is connected to the power supply line PL1 through a PMOS transistor of the inverter circuit 113 and a PMOS transistor of the inverter circuit 115 with a low impedance. When the input potential is at a high level, an internal node 119 is connected to the power supply line PL2 through an NMOS transistor of the inverter circuit 113 and an NMOS transistor of the inverter circuit 115. Therefore, if the internal nodes 118 and 119 of the latch circuit are made as the quasi-power lines QL1 and QL2 in common to other circuits, the electric power is supplied to the circuit constituted of the low threshold MOSFETs in the standby mode, with the result that the power consumption becomes increased.

Because of this, the power switches must be provided for each latch circuit. However, since the power switches cannot be made large because of the restriction of the area, the operation speed of the latch circuit becomes slow.

In order to overcome the above mentioned problem, the technology called a "balloon" is proposed by SHIGEMATSU et al in 1995 Symposium on VLSI Circuits Digest, pp.125–126 (this will be called a second prior art). FIG. 14 is an example of applying this balloon technology to the prior art latch shown in FIG. 12. The latch circuit shown in FIG. 14 is the prior art latch circuit connected with a memory cell. In the drawing, a left side circuit part is the prior art latch circuit added with complementary path transistors 125. In this part, all the path transistors are formed of the low threshold MOSFETs. Power terminals of this part are connected to the quasi-power lines QL1 and QL2, respectively. The memory cell is constituted of complementary path transistors 126 and 127 and inverter circuits 128 and 129, and is connected to an internal node 130 of the latch circuit.

The path transistors 127 are constituted of the low threshold MOSFETs, and the path transistors 126 and the inverter circuits 128 and 129 are constituted of the high threshold MOSFETs. Power terminals of the inverter circuits 128 and 129 are connected to the power supply lines PL1 and PL2, respectively.

Control signals B2 and B2B are supplied to the effect that in the active mode, the path transistors 125 are turned on, and the path transistors 127 are turned off, and in the standby mode, these conditions are inverted. When it becomes the standby mode and when it returns to the active mode, control signals B1 and B1B are supplied to turn on the path transistors 126, so that the internal node 130 of the latch circuit is connected to the memory cell. Thus, information to be held is written into the memory cell before it enters the standby mode, and the information is read out from the memory cell before it returns to the active mode.

In the standby mode, the memory cell is separated from the latch circuit, and internal nodes other than the memory cell can be put in a floating condition. Therefore, the quasi-power lines QL1 and QL2 can be used in common to the other circuits. Accordingly, since the power switches can be made in common to the other circuits and can be enlarged in size, the high speed operation can be realized.

Another technology of setting the active mode and the standby mode and of stopping the supplying of the electric power in the standby mode, similarly to the above prior art, is proposed by for example Japanese Patent Application Pre-examination Publication No. JP-A-05-291929 (corresponding, in part, to U.S. Pat. No. 5,583,457, the content of which is incorporated by reference in its entirety into this application) (this will be called a third prior art).

FIG. 15 is an example of applying the third prior art to an inverter circuit. A PMOS transistor 131 and an NMOS transistor 132 are the low threshold MOSFETs, and constitute an inverter circuit INV. One power supply terminal of the inverter circuit is connected to a high level power supply line VHH, and the other power supply terminal of the inverter circuit is connected to a low level power supply line VLL. A PMOS transistor 133 and an NMOS transistor 134 are the high threshold MOSFETs, and operate as a power switch. Control signals SWU and SWL are supplied to gate terminals of these transistors so that the power switches are turned off in the standby mode. A level hold circuit is constituted of inverter circuits 135 and 136, and constituted of the high threshold MOSFETs. Power supply terminals of the level hold circuit are connected directly to the power supply lines VHH and VLL.

In the standby mode, necessary information is held in the level hold circuit. In the third prior art, no latch circuit is described, but when the third prior art is used with the latch circuit, for example the latch circuit shown in FIG. 12 is inserted into a portion of the inverter circuit INV in FIG. 15.

As mentioned hereinbefore, the latch circuit of the first prior art has a problem in which, since the power switches must be provided for each one latch circuit, the power switches cannot be very enlarged, so that the operation speed is slow. There is another problem in which the power switch for the logic circuit must be inserted to both a high level power supply line side and a low level power supply line side. This is because the complementary path transistors 111 of the latch circuit shown in FIG. 13 are constituted of the low threshold MOSFETs. In the standby mode, the complementary path transistors 111 are in the OFF condition, there is possibility that the subthreshold current flows through a preceding stage circuit. In order to prevent this problem, in the preceding stage logic circuit, the power switch must be inserted to both a high level power supply line side and a low level power supply line side. Of course, if the complementary path transistors 111 are constituted of the high threshold MOSFETs, it becomes sufficient if the power switch is inserted to only one side, but with this arrangement, the operation speed of the latch circuit becomes very slow.

The latch circuit of the second prior art can overcome the problem in the latch circuit of the first prior art, but has another problem in which the control signals are many, and therefore, a fine timing control is required in the operation for changing over the mode.

The third prior art has a problem in which the power switch for the logic circuit must be inserted to both a high level power supply line side and a low level power supply line side, similarly to the first prior art.

SUMMARY OF THE INVENTION

Accordingly, it is an object of the present invention to provide a semiconductor integrated circuit which can reconcile a high speed operation in an active mode and a low power consumption in a standby mode.

Another object of the present invention is to provide such a semiconductor integrated circuit with a reduced number of required control signals, without requiring the fine timing control for changing over the mode, and with the power switch which is provided for the low threshold logic circuit and which is sufficient if it is inserted to only either of a high level power supply line side and a low level power supply line side.

The latch circuit used in the semiconductor integrated circuit in accordance with the present invention having the active mode and the standby mode, is characterized in that a high threshold first conductivity type MOSFET and a low threshold second conductivity type MOSFET are used as MOSFETs applied with a control signal, and a voltage amplitude of the control signal is larger than a power supply voltage It is also characterized in that, as the control signal, a clock signal is supplied in the active mode, and a signal for creating an information hold condition is supplied in the standby mode.

In order to achieve the high speed operation in the active mode, it is necessary to elevate an effective gate voltage ($V_{GS}$–$V_T$) of the MOSFET in the ON condition. Here, $V_{GS}$ is a voltage between a gate terminal and a source terminal of the MOSFET. On the other hand, in order to achieve the low power consumption in the standby mode, it is necessary to lower the effective gate voltage ($V_{GS}$–$V_T$) of the MOSFET in the OFF condition. In the first conductivity type MOSFET, the former can be realized by a high $V_{GS}$, and the latter can be realized by a high $V_T$. In the second conductivity type MOSFET, the former can be realized by a low $V_{GS}$, and the latter can be realized by a low $V_T$. With this arrangement, the high speed operation in the active mode and the low power consumption in the standby mode can be made compatible with each other. In addition, in the standby mode, since complementary path transistors at an input of the latch circuit can be put in a completely OFF condition, the latch circuit can be isolated from a preceding stage, and therefore, it is sufficient if the power switch for the low threshold logic circuit is inserted to only either of the high level power supply voltage side and the low level power supply voltage side.

In addition, if, as the control signal, the clock signal is supplied in the active mode, and the signal for creating the information hold condition is supplied in the standby mode, the power switch for the latch circuit can be caused to have a function of the complementary path transistors. Therefore, since the latch circuit is completely isolated from the preceding stage by a gate oxide film of the MOSFET, it is sufficient if the power switch for the low threshold logic circuit is inserted to only either of the high level power supply voltage side and the low level power supply voltage side.

DESCRIPTION OF THE PREFERRED EMBODIMENTS

Now, embodiments of the semiconductor integrated circuit in accordance with the present invention will be described with reference to the drawings.

Figure 1:
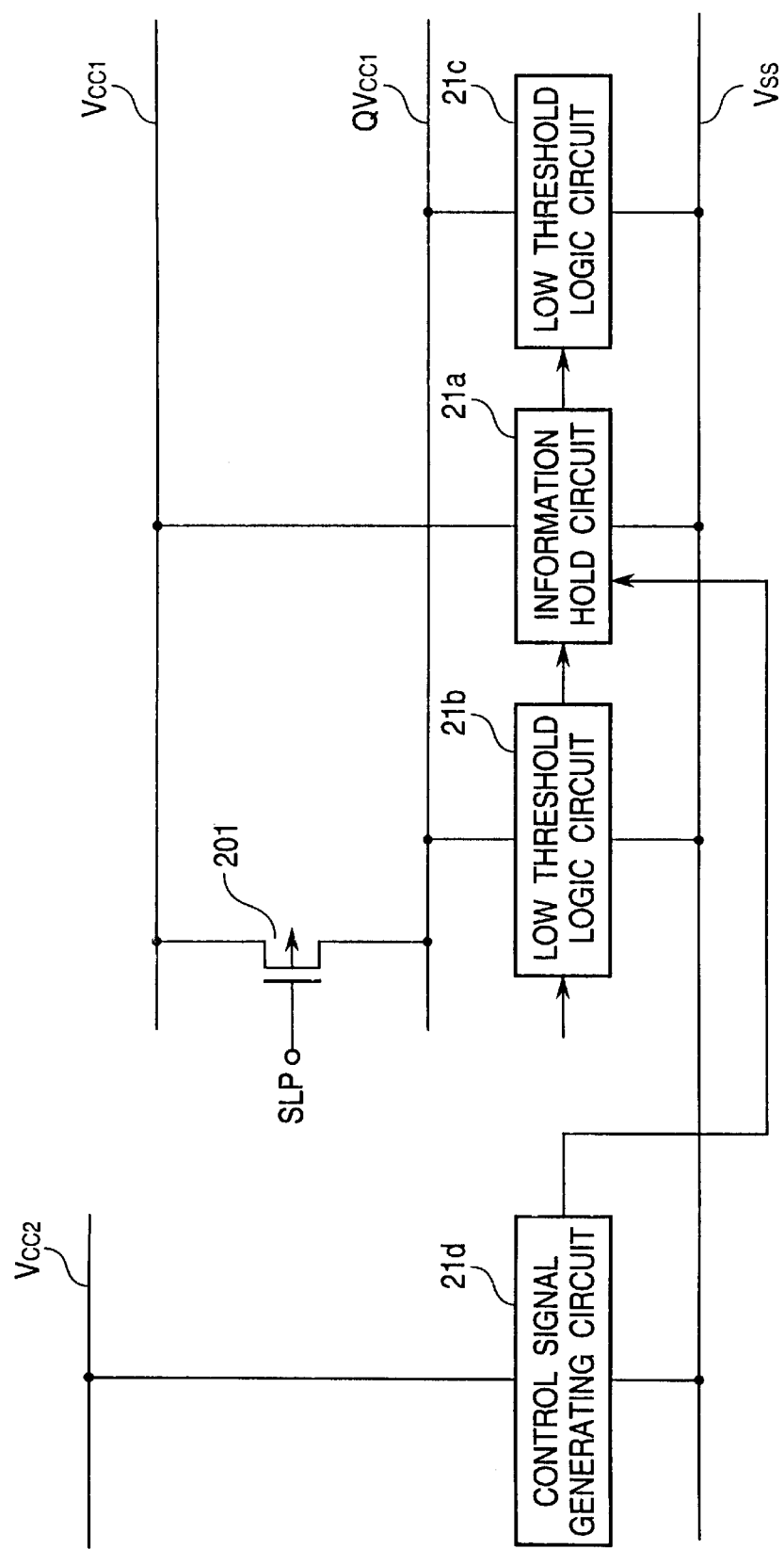
FIG. 1 is a diagram for illustrating a first embodiment of the semiconductor integrated circuit in accordance with the present invention.
Figure 2:
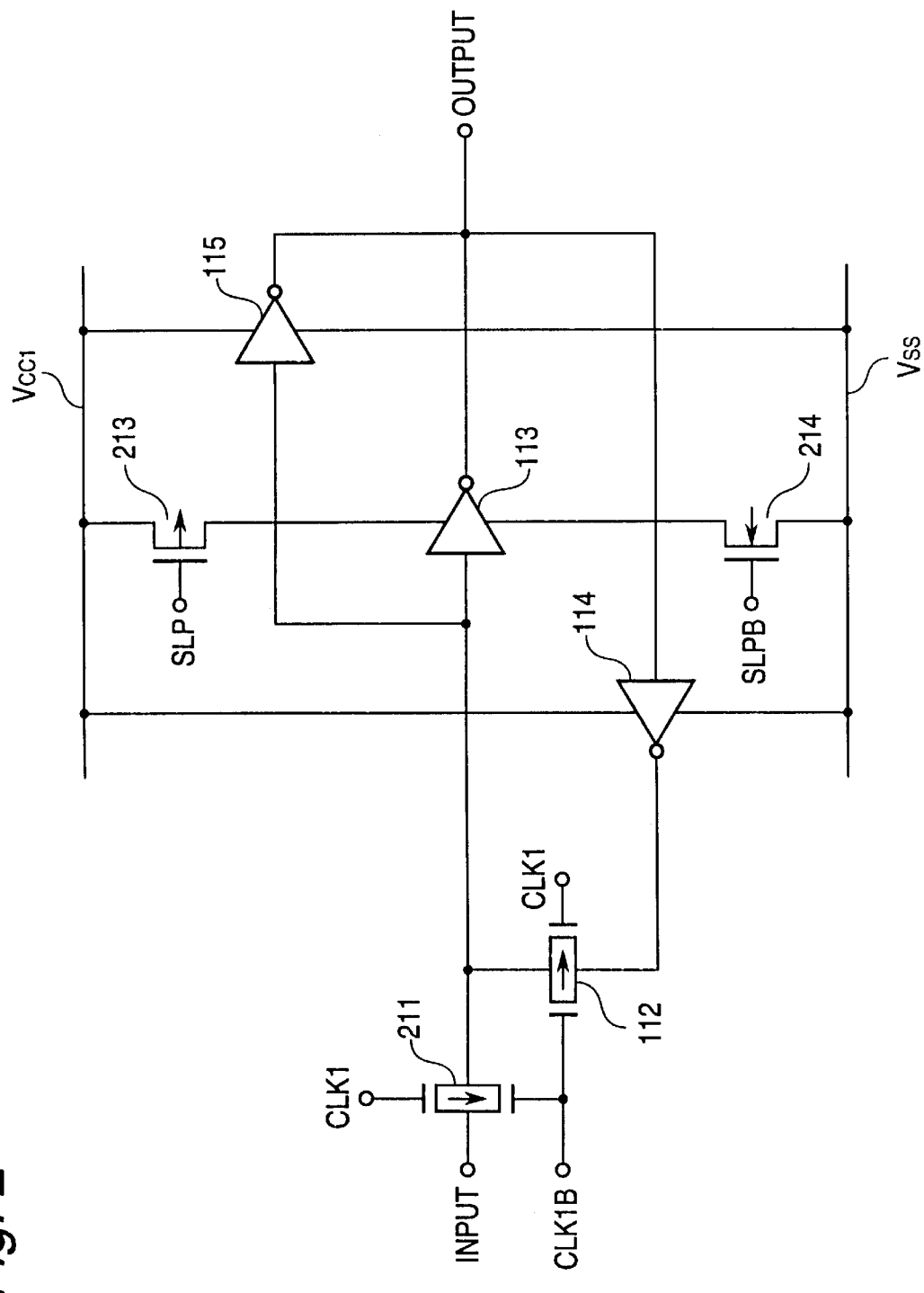
FIG. 2 is a diagram for illustrating a first example of the information hold circuit (latch circuit) shown in FIG. 1.

Here, FIG. 1 is a circuit diagram for illustrating a first embodiment of the semiconductor integrated circuit in accordance with the present invention, and FIG. 2 is a diagram for illustrating a first example of the latch circuit used as the information hold circuit. Referring to FIGS. 1 and 2, a high threshold NMOS transistor and a low threshold PMOS transistor are used as MOSFETs applied with a control signal in a latch circuit, and a high level voltage of the control signal is made to $V_{CC2}$ which is higher than the power supply voltage $V_{CC1}$ supplied to a latch circuit (information hold circuit 21a) and others. In addition, logic circuits 21b and 21c are constituted of low threshold MOSFETs, and a high level side power supply terminal of the logic circuit is connected through a power switch 201 to the power supply line $V_{CC1}$, and a low level side power supply terminal is connected directly to the other power supply line $V_{SS}$. In a standby mode, this power switch is turned off to stop the supplying of the electric power, so that the low power consumption is realized.

The following description will be made under the assumption that the power supply line $V_{CC1}$ is at 1.0V, the power supply line $V_{CC2}$ is at 1.3V, the power supply line $V_{SS}$ is at 0.0V, the high threshold is ±0.5V, and the low threshold is ±0.2V.

In FIG. 1, a control signal SLP is supplied to a rate of the low threshold PMOS transistor 201 so that the PMOS transistor 201 is on in the active mode and off in the standby mode. $V_{CC2}$ is supplied to a control signal generating circuit 21d as a high level side power supply voltage, so that the control signal generating circuit 21d generates a control signal having a low level of 0.0V and a high level of 1.3V.

Figure 13:
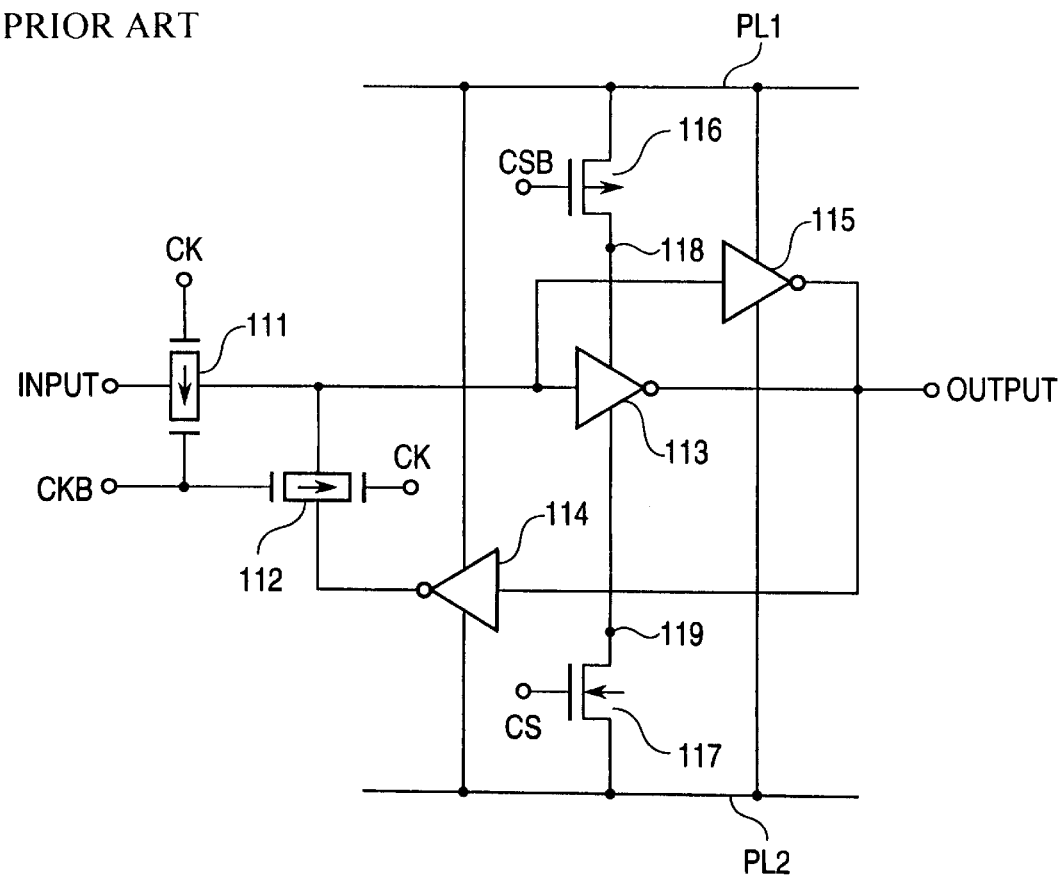
FIG. 13 is a diagram for illustrating another example of the information hold circuit (latch circuit) used in the prior art semiconductor integrated circuit.
Figure 14:
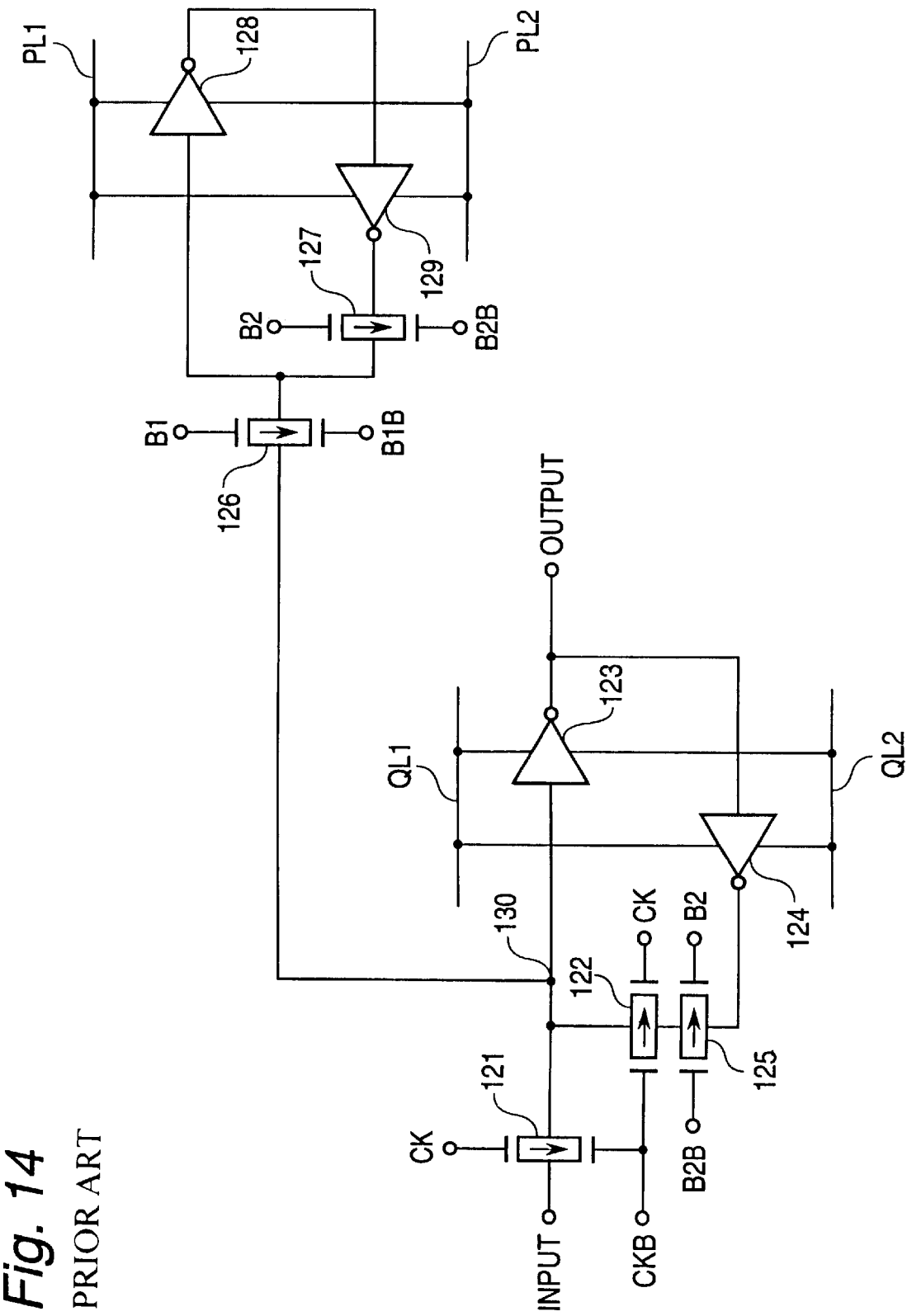
FIG. 14 is a diagram for illustrating still another example of the information hold circuit (latch circuit) used in the prior art semiconductor integrated circuit.

The latch circuit shown in FIG. 2 has the circuit construction similar to that of the latch circuit shown in FIG. 13, but is different from the latch circuit shown in FIG. 13, in the threshold of MOSFETs in part and in a signal amplitude of the control signal. In the following, only the different features will be described.

Complementary path transistors 211 are constituted of a low threshold PMOS transistor and a high threshold NMOS transistor, and clocks CLK1 and CLK1B are applied as the control signals. The control signals CLK1 and CLK1B take the low level of 0.0V and the high level of 1.3V. An effective gate voltage ($V_{GS}-V_T$) in the ON condition is (−1.0)−(−0.2)=−0.8(V) in the PMOS transistor and 1.3−0.5=0.8(V) in the NMOS transistor, so that both are sufficiently high and therefore a high speed operation can be realized.

On the other hand, the effective gate voltage in the OFF condition is (0.3)−(−0.2)=0.5(V) in the PMOS transistor and 0.0−0.5=0.5(V) in the NMOS transistor, so that both are sufficiently low and therefore a low power consumption can be realized.

Furthermore, in the standby mode, since the shown circuit is completely isolated from a preceding stage by the complementary path transistors 211, it is sufficient if the power switch for the low threshold logic circuit is inserted to only either of the high level power supply voltage side and the low level power supply voltage side.

A low threshold PMOS transistor 213 and a high threshold NMOS transistor 214 constitute power switches for the inverter circuit 113, respectively. Control signals SLP and SLPB take the low level of 0.0V and the high level of 1.3V. Therefore, the effective gate voltage in the ON condition can be made higher than that in the first prior art by 0.3V, a small MOSFET can have a large current supplying capability, so that the high speed operation can be realized. In another embodiment, transistor 214 may be a P-channel MOSFET and transistor 213 may be an N-channel MOSFET. Transistor 214 would similarly have a higher threshold than transistor 213.

Incidentally, the high level side power supply voltage $V_{CC2}$ of the control signal generating circuit 21d can be easily generated from $V_{CC1}$ by means of for example a charge pump circuit.

Figure 3:
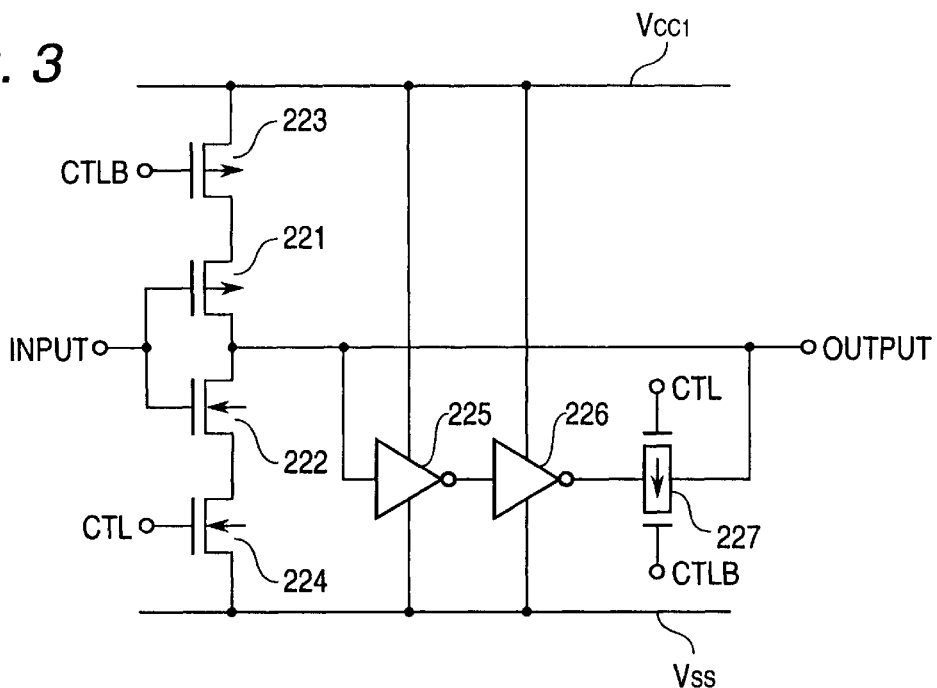
FIG. 3 is a diagram for illustrating a second example of the information hold circuit (latch circuit) shown in FIG. 1.
Figure 4:
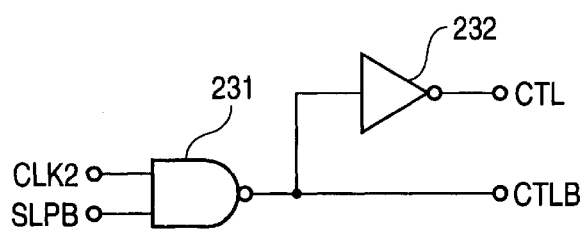
FIG. 4 is a diagram for illustrating one example of the control signal generating circuit shown in FIG. 1.

FIG. 3 is a diagram for illustrating a second example of the latch circuit used in the semiconductor integrated circuit in accordance with the present invention, and FIG. 4 is a diagram for illustrating one example of the control signal generating circuit. In addition, FIG. 5 illustrates the waveform of the control signals.

In the shown latch circuit, high threshold NMOS transistors and low threshold PMOS transistors are used as MOSFETs applied with a control signal, and a high level voltage of the control signal is made higher than the power supply voltage $V_{CC1}$ supplied to the latch circuit. In addition, the clock signal is supplied in the active mode, and the signal for creating the information hold condition is supplied as the control signal in the standby mode. With this arrangement, the power switch for the latch circuit shown in FIG. 13 can be caused to have a function of the complementary path transistors 111.

In FIG. 3, the shown latch circuit comprises a low threshold PMOS transistor 221, a low threshold NMOS transistor 222, a low threshold PMOS transistor 223, a high threshold NMOS transistor 224 and complementary path transistors 227. Inverter circuits 225 and 226 are constituted of high threshold MOSFETs.

Figure 5:
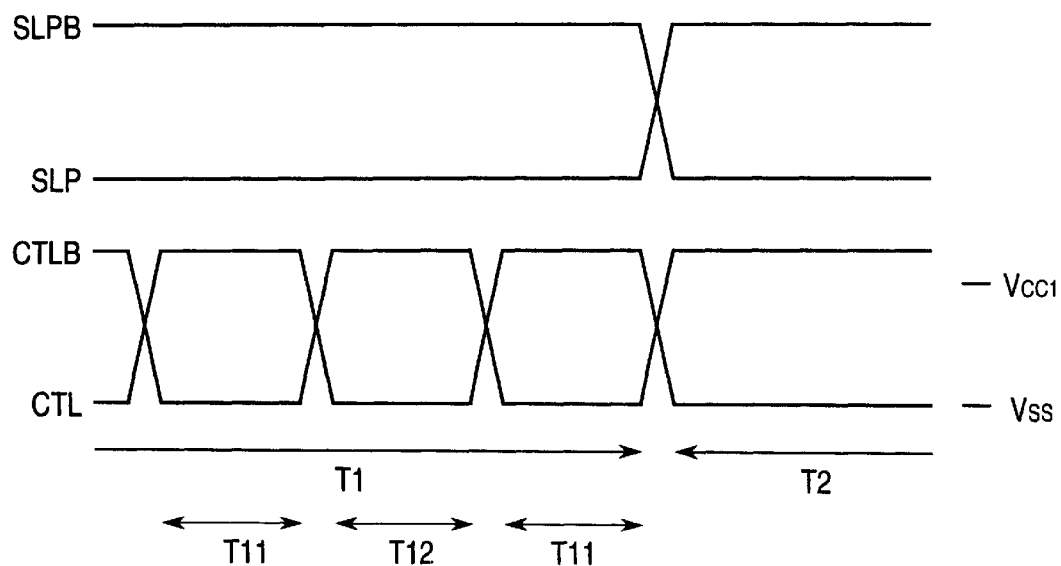
FIG. 5 is a diagram illustrating the waveform of the control signals.

Control signals CTLB and CTL shown in FIG. 5 are supplied to a gate of the PMOS transistor 223 and the NMOS transistor 224, respectively. In FIG. 5, T1 indicates the active mode period, and T2 shows the standby mode period. In addition, T11 indicates an information fetching period.

When the control signal CTLB is at the low level and the control signal CTL is at the high level, both of the PMOS transistor 223 and the NMOS transistor 224 are in the ON condition, so that an input signal is inverted by the PMOS transistor 221 and the NMOS transistor 222 and the inverted signal is outputted. Similarly to the PMOS transistor 213 and the NMOS transistor 214 shown in FIG. 2, since the effective gate voltage of the PMOS transistor 223 and the NMOS transistor 224 is sufficiently high in the ON condition, even a small MOSFET can have a sufficient current supply capability, so that the high speed operation is realized. In this operation, since the complementary path transistors 227 are in the OFF condition, the complementary path transistors 227 gives no influence to the above mentioned operation.

T12 shown in FIG. 5 indicates an information holding period, in which the control signal CTLB is at the high level and the control signal CTL is at the low level, so that both of the PMOS transistor 223 and the NMOS transistor 224 are in the OFF condition and therefore the input signal gives no influence to the output. On the other hand, since the complementary path transistors 227 are in the ON condition, the information fetched in the just preceding period T11 is held in the inverter circuits 225 and 226. As mentioned above, T2 is the standby mode period, in which the operation of the latch circuit is the same as that in the period T12. Similarly to the PMOS transistor 213 and the NMOS transistor 214 shown in FIG. 2, since the effective gate voltage of the PMOS transistor 223 and the NMOS transistor 224 is sufficiently low in the OFF condition, these transistors are put in a complete OFF condition, and therefore, the sub-threshold current in the standby mode is very small. In addition, since the inverter circuits 225 and 226 are constituted of the high threshold MOSFETs, the sub-threshold current in the standby mode is very small.

Incidentally, since the complementary path transistors 227 gives no influence to the operation speed, both of a PMOS transistor and an NMOS transistor can have a high threshold. In addition, the high level voltage of the control signal can be the same as the power supply voltage $V_{CC1}$ supplied to the latch circuit and others.

Figure 15:
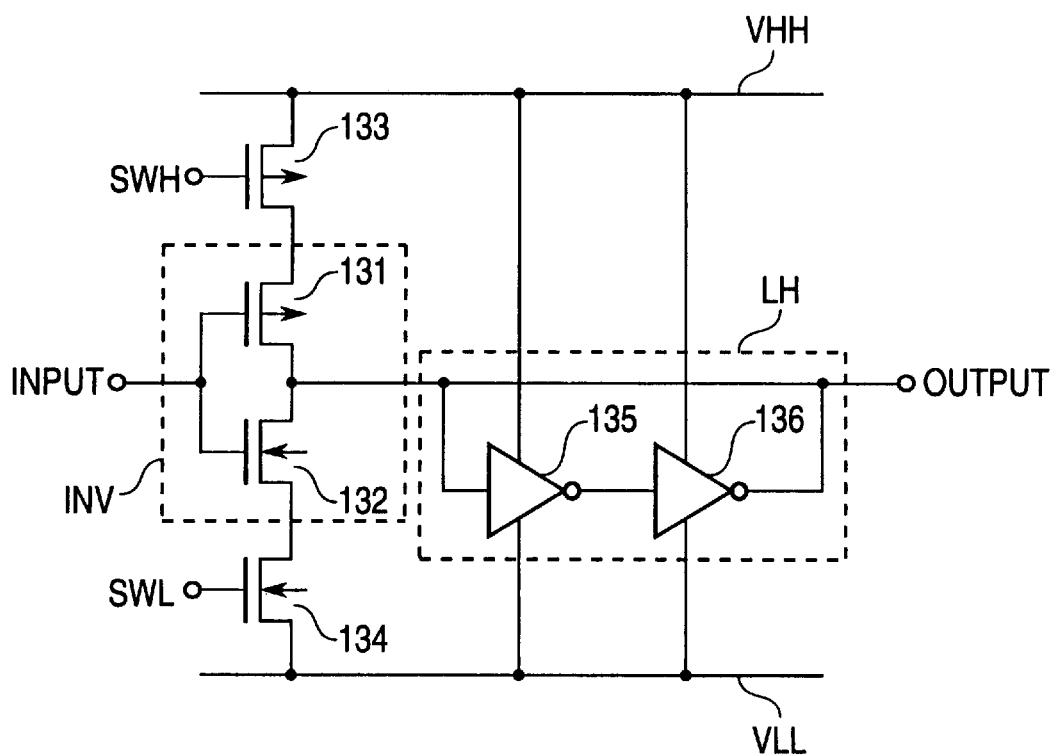
FIG. 15 is a diagram for illustrating another example of the prior art semiconductor integrated circuit.

In this latch circuit, the latch circuit is completely isolated from a preceding stage by a gate oxide film of the MOSFETs, it is sufficient if the power switch for the low threshold logic circuit is inserted to only either of the high level power supply voltage side and the low level power supply voltage side. Incidentally, this latch circuit is similar to the circuit shown in FIG. 15 at a first glance, however, the circuit shown in FIG. 15 is the inverter circuit, and this circuit is used as the latch circuit. In this latch circuit, the high threshold first conductivity type MOSFET and the low threshold second conductivity type MOSFET are used as MOSFETs applied with a control signal, and the voltage amplitude of the control signal is larger than the power supply voltage supplied to the latch circuit. With this arrangement, even if a large MOSFET is not used, the high speed operation in the active mode and the low power consumption in the standby mode can be made compatible with each other.

Referring to FIG. 4, the shown control signal generating circuit includes a NAND gate 231 and an inverter gate 232. The ordinary clock signal CLK2 and the signal SLPB shown in FIG. 5 for selectively setting the active mode and the standby mode, are supplied to the control signal generating circuit 21d as input signals. The control signal generating circuit 21d generates the control signals CTL and CTLB.

Figure 6:
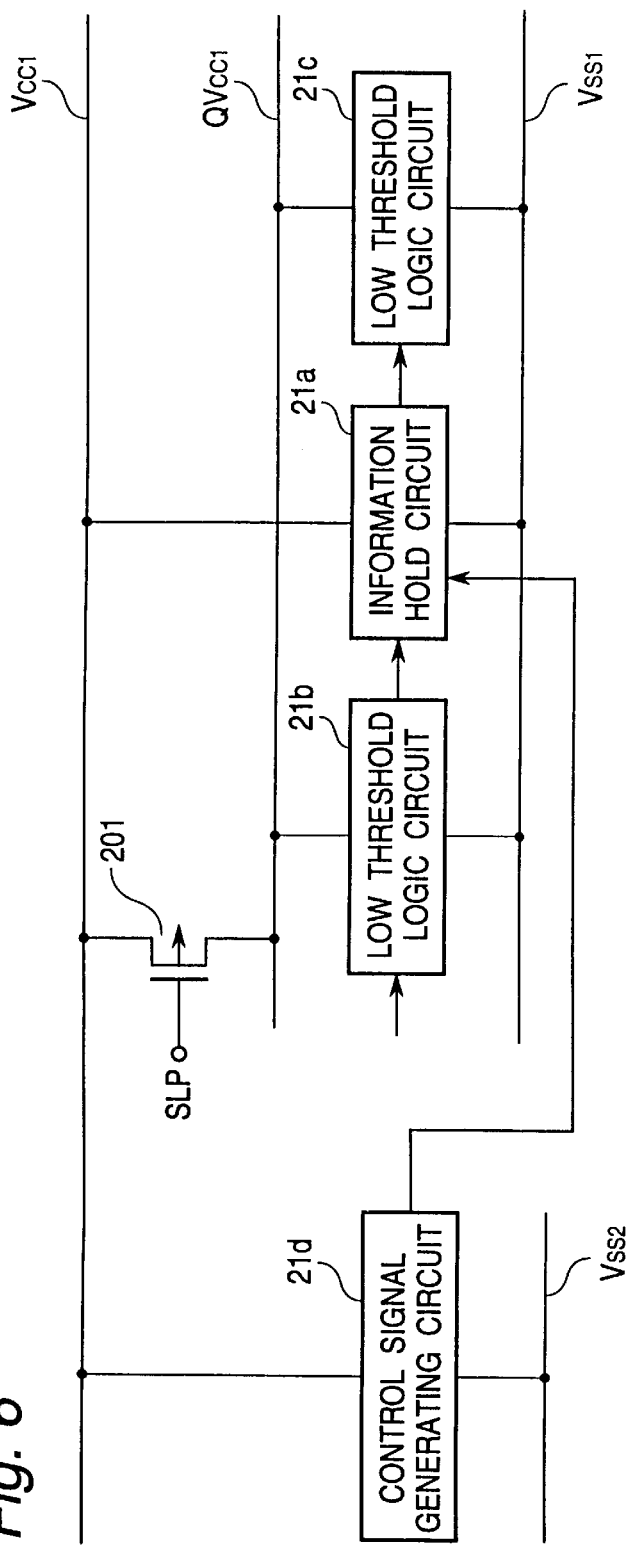
FIG. 6 is a diagram for illustrating a second embodiment of the semiconductor integrated circuit in accordance with the present invention.
Figure 7:
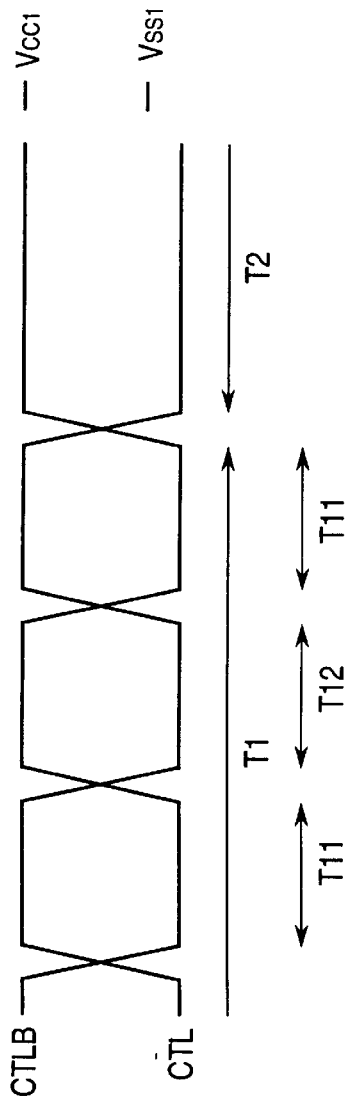
FIG. 7 is a diagram illustrating the waveform of the control signals used in the semiconductor integrated circuit shown in FIG. 6.

FIG. 6 is a circuit diagram for illustrating a second embodiment of the semiconductor integrated circuit in accordance with the present invention, and FIG. 7 is a diagram illustrating the waveform of the control signals. A point of the embodiment shown in FIG. 6 differing from the first embodiment is that a low threshold NMOS transistor and a high threshold PMOS transistor are used as MOSFETs applied with a control signal, and a low level voltage of the control signal is lower than the power supply voltage Vss1 supplied to the latch circuit. Since the other points are similar to the first embodiment, further explanation will be omitted.

Figure 8:
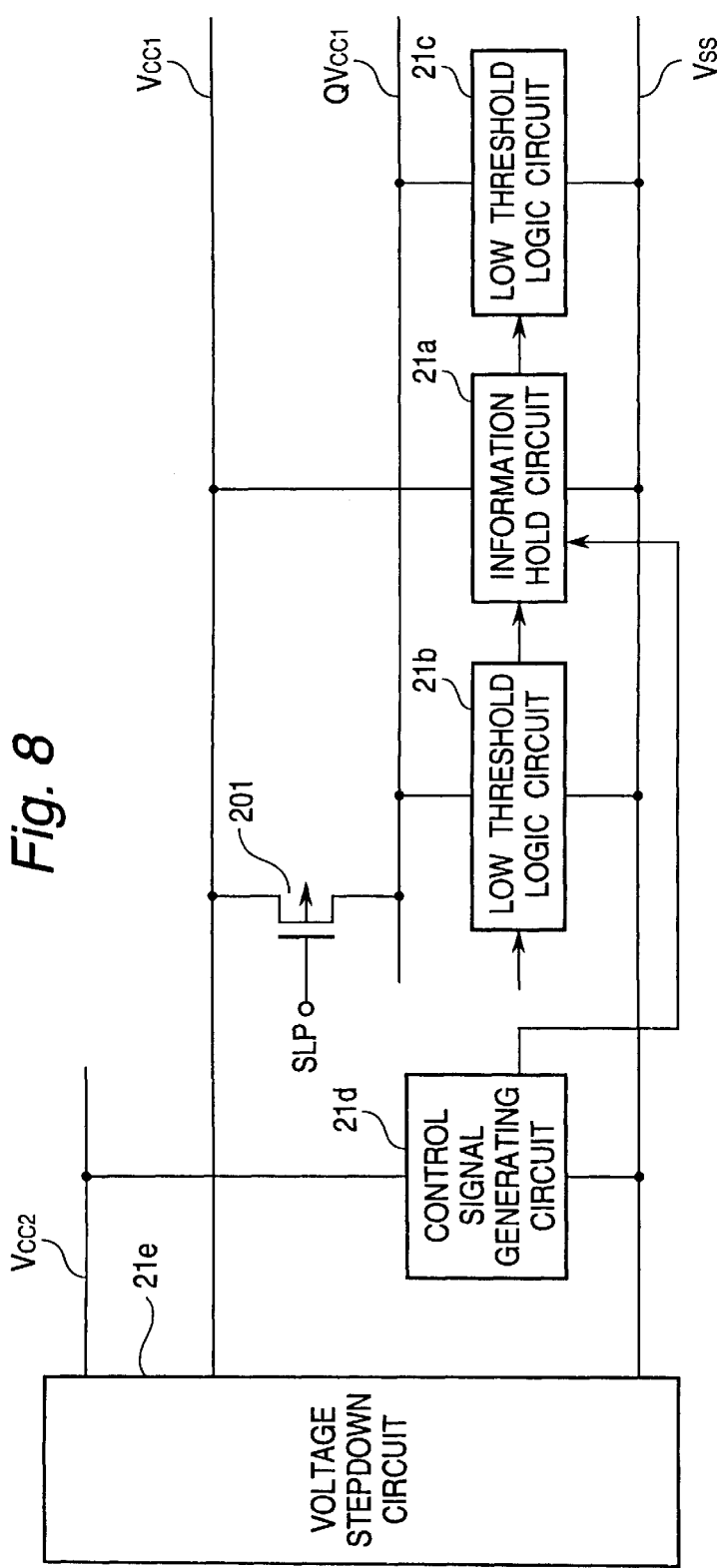
FIG. 8 is a diagram for illustrating a third embodiment of the semiconductor integrated circuit in accordance with the present invention.

FIG. 8 is a circuit diagram for illustrating a third embodiment of the semiconductor integrated circuit in accordance with the present invention. A point of the embodiment shown in FIG. 8 differing from the first embodiment is that the power supply voltage Vcc2 is supplied from an external, and the power supply voltage Vcc1 is generated by a power supply voltage stepdown circuit 21e.

Figure 9:
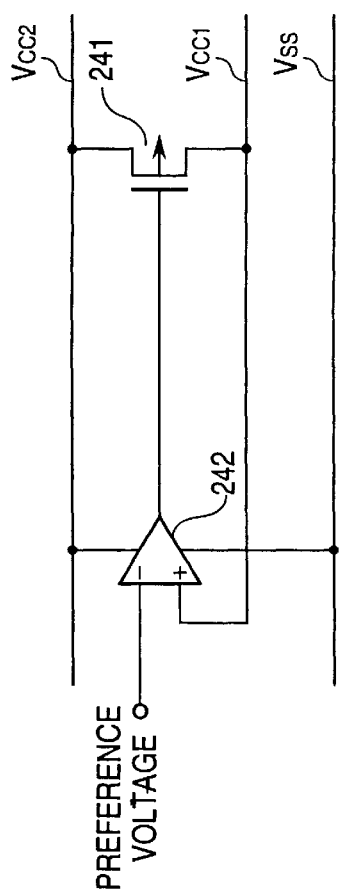
FIG. 9 is a diagram for illustrating a first example of the voltage stepdown circuit shown in FIG. 8.

FIG. 9 illustrates the power supply voltage stepdown circuit using a three-terminal regulator, as one example of the power supply voltage stepdown circuit. A source terminal of a PMOS transistor 241 is connected to the power supply potential Vcc2, and a drain terminal outputs the power supply potential Vcc2. In a comparator 242, an inverting input is connected to a reference voltage, and a non-inverting input is connected to the drain terminal of the PMOS transistor 241. An output of the comparator 242 is connected to a gate of the PMOS transistor 241.

Here, the power supply voltage to be outputted (in this case, 1.0V) is used as the reference voltage. However, the reference voltage can be easily obtained, for example by resistor-dividing the voltage between Vcc2 and Vss. When Vcc1 is lower than the desired voltage, the output of the comparator 242 becomes Vss so that the PMOS transistor 241 is turned on to elevate the voltage of Vcc1. When Vcc1 is higher than the desired voltage, the output of the comparator 242 becomes Vcc2 so that the PMOS transistor 241 is turned off.

This power supply voltage stepdown circuit has no function for lowering the voltage of Vcc1. However, there is no problem. This is because the voltage of Vcc1 lowers as the result of the fact that the logic circuit and others connected to Vcc1 operate. However, it would be a matter of course that there can be provided a function of lowering the voltage when Vcc1 is higher than the desired voltage.

Figure 10:
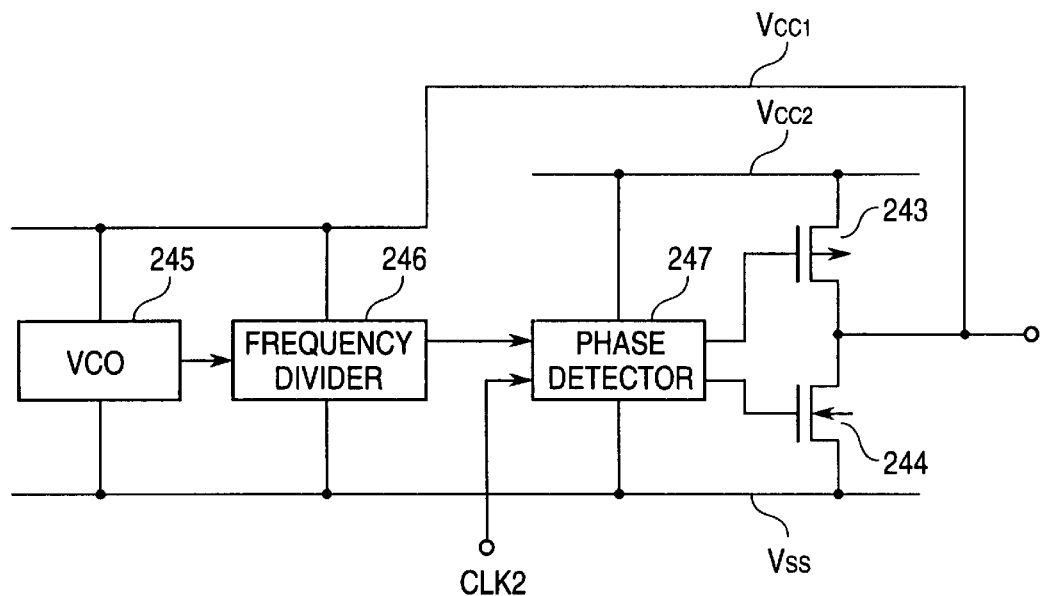
FIG. 10 is a diagram for illustrating a second example of the voltage stepdown circuit shown in FIG. 8.
Figure 11:
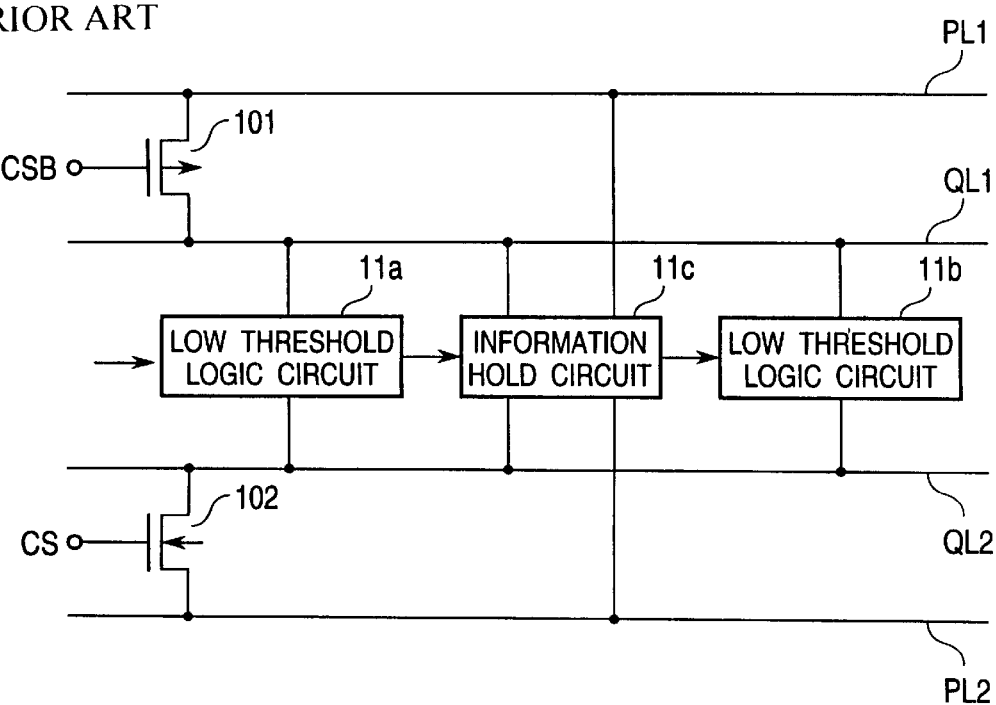
FIG. 11 is a diagram for illustrating one example of the prior art semiconductor integrated circuit.
Figure 12:
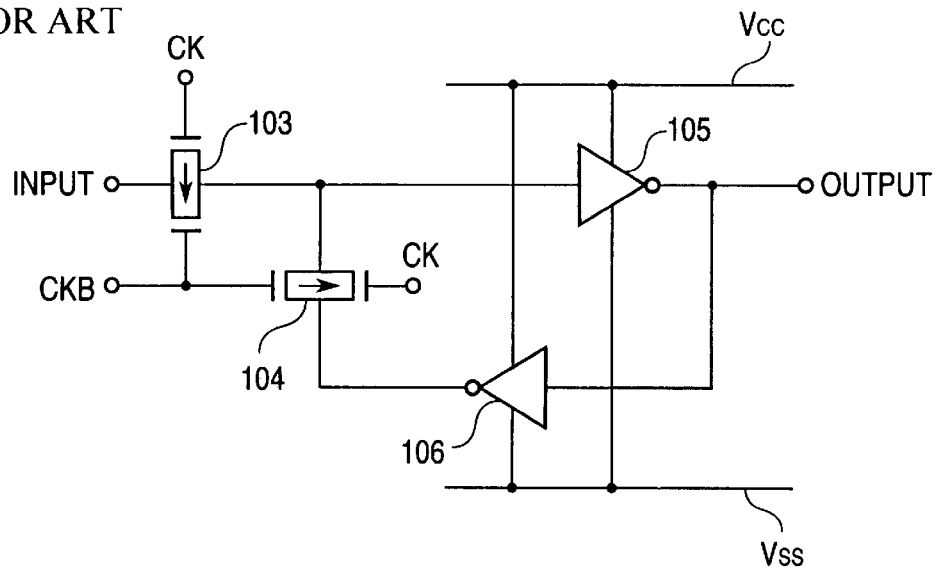
FIG. 12 is a diagram for illustrating one example of the information hold circuit (latch circuit) used in the prior art semiconductor integrated circuit.

FIG. 10 is a diagram for illustrating a second example of the power supply voltage stepdown circuit. The power supply potential Vcc1 required for the low threshold logic circuits 21b and 21c (FIG. 8) to operate with the frequency of the clock signal CLK2, is supplied by a voltage controlled oscillator circuit (VCO) 245, a frequency divider 246, a phase detector 247, a PMOS transistor 243 and an NMOS transistor 244. A source terminal of the PMOS transistor 243 is connected to the power supply potential Vcc2, and a source terminal of the NMOS transistor 245 is connected to the power supply potential Vss. Drain terminals of the PMOS transistor 243 and the NMOS transistor 244 are connected to each other so as to output the power supply potential Vcc1. Gate terminals of the PMOS transistor 243 and the NMOS transistor 244 are supplied with an output of the phase detector 247.

The VCO 245 is constituted of for example a ring oscillator and supplied with an electric power by the power supply potential Vcc1. The oscillation frequency f changes dependently upon the voltage of Vcc1, so that if Vcc1 is high, the VCO oscillates with a high frequency, and if Vcc1 is low, the VCO oscillates with a low frequency.

The frequency divider 246 frequency-divides the oscillation frequency of the VCO 245 to l/m. The phase comparator 247 compares the phase of the signal having the frequency f/m outputted from the frequency divider 246, with the phase of the clock CLK2, and controls the PMOS transistor 243 and the NMOS transistor 244 as follows: When the phase of the clock CLK2 is advanced, the phase comparator 247 brings the PMOS transistor 243 into the ON condition and the NMOS transistor 244 into the OFF condition. On the other hand, when the phase of the clock CLK is delayed, the phase comparator 247 brings the PMOS transistor 243 into the OFF condition and the NMOS transistor 244 into the ON condition. With this operation, the voltage of the power supply potential Vcc1 changes, so that the signal having the frequency f/m and the clock CLK2 are controlled to become equal in phase.

In a condition in which the phases are equal to each other, the signal having the frequency f/m and the clock CLK2 become equal in frequency. For example, assuming that a critical path of the low threshold circuits 21b and 21c is "n" times the delay time of each of unitary gates constituting the VCO 245, if the number of unitary gates in the ring oscillator constituting the VCO 245 is "n/m", this result in that the voltage of the power supply potential Vcc1 is controlled to make the delay time of the critical path of the low threshold circuit, equal to the period of the clock CLK2. Actually, if the number of unitary gates in the ring oscillator constituting the VCO 245 is set to have a some degree of margin, it is possible to supply, as the power supply potential Vcc1, a minimum voltage required for the low threshold logic circuit to surely operate with the frequency of the clock signal CLK2. With this arrangement, when the circuit is allowed to operate at a low speed, if the frequency of the clock signal CLK2 is lowered, the voltage of the power supply potential Vcc1 lowers, so that the power consumption in the active mode can be reduced.

Incidentally, in the above mentioned embodiments, the power switch for the low threshold logic circuit is inserted at the high level power supply voltage line side, but it would be a matter of course that the power switch for the low threshold logic circuit can be inserted at the low level power supply voltage line side.

As mentioned above, according to the present invention, not only it is possible to make the high speed operation in the active mode and the low power consumption in the standby mode compatible with each other, but also it is sufficient if the power switch for the logic circuit is inserted at only either of the high level power supply voltage line side and the low level power supply voltage line side. In addition, the control signals required for the latch circuit and others are very few, and a fine timing control for changing over the mode is no longer required.

What is claimed is:

1. A latch circuit in a semiconductor integrated circuit having an active mode and a standby mode, based on a first control signal, said latch circuit comprising:
    a first inverter circuit for receiving an input signal;
    a first conductivity type MOSFET having a first threshold and having a first terminal connected to a first power supply and a second terminal connected to said first inverter circuit;
    a second conductivity type MOSFET having a second threshold higher than said first threshold and having a first terminal connected to a second power supply having a lower voltage than said first power supply and a second terminal connected to said first inverter circuit;

an information hold loop for receiving an output from said first inverter circuit and holding information in said standby mode, said information hold loop comprising second and third inverter circuits, each having a first power terminal connected to said first power supply and a second power terminal connected to said second power supply; and a control signal generating circuit for receiving a clock signal and said first control signal, and for outputting a second control signal which is input to said first conductivity type MOSFET and a third control signal which is input to said second conductivity type MOSFET, wherein a high level voltage amplitude of said first control signal is higher than high level voltage amplitudes of said first power supply and said second power supply, wherein said semiconductor integrated circuit is in active mode when said first control signal has a first voltage amplitude and is in standby mode when said first control signal has a second voltage amplitude which is different from said first voltage amplitude, and wherein in said active mode, said first control signal comprises a clock signal and in said standby mode, said first control signal comprises a signal for creating an information hold condition.

2. A latch circuit claimed in claim 1, wherein said first conductivity type MOSFET comprises a P-channel MOSFET and said second conductivity type MOSFET comprises an N-channel MOSFET.

3. A latch circuit claimed in claim 1, wherein during an information fetching period of said active mode, said second control signal is at a low level and said third control signal is at a high level, such that said first inverter circuit generates an inverted input signal, and wherein during a standby mode and an information holding period of said active mode, said second control signal is at a high level and said third control signal is at a low level, such that said first conductivity type MOSFET and said second conductivity type MOSFET are in an off condition and information fetched during a preceding information fetching period is held in said information hold loop.

4. A semiconductor integrated circuit having an active mode and a standby mode, based on a first control signal, comprising:

a latch circuit comprising:
a first inverter circuit for receiving an input signal;
a first conductivity type MOSFET having a first threshold and having a first terminal connected to a first power supply and a second terminal connected to said first inverter circuit;
a second conductivity type MOSFET having a second threshold higher than said first threshold and having a first terminal connected to a second power supply having a lower voltage than said first power supply and a second terminal connected to said first inverter circuit; and
an information hold loop for receiving an output from said first inverter circuit and holding information in said standby mode, said information hold loop comprising second and third inverter circuits, each having a first power terminal connected to said first power supply and a second power terminal connected to said second power supply, a control signal generating circuit, for inputting a clock signal and said first control signal and outputting a second control signal which is input to said first conductivity type MOSFET and a third control signal which is input to said second conductivity type MOSFET;
wherein a high level voltage amplitude of said first control signal is higher than high level voltage amplitudes of said first power supply and said second power supply,
wherein said semiconductor integrated circuit is in active mode when said first control signal has a first voltage amplitude and is in standby mode when said first control signal has a second voltage amplitude which is different from said first voltage amplitude,
wherein in said active mode, said first control signal comprises a clock signal and in said standby mode, said first control signal comprises a signal for creating an information hold condition; and a logic circuit for generating said input signal.

5. A latch circuit claimed in claim 4, wherein during an information fetching period of said active mode, said second control signal is at a low level and said third control signal is at a high level, such that said first inverter circuit generates an inverted input signal, and wherein during a standby mode and an information holding period of said active mode, said second control signal is at a high level and said third control signal is at a low level, such that said first conductivity type MOSFET and said second conductivity type MOSFET are in an off condition and information fetched during a preceding information fetching period is held in said information hold loop.

6. A semiconductor integrated circuit claimed in claim 4, wherein said first conductivity type MOSFET comprises an a P-channel MOSFET and said second conductivity type MOSFET comprises an N-channel MOSFET.

7. A semiconductor integrated circuit having an active mode and a standby mode, comprising:

a latch circuit comprising:
a first conductivity type MOSFET having a first threshold;
a second conductivity type MOSFET having a second threshold lower than said first threshold; and
a control signal which is input to said first conductivity type MOSFET and said second conductivity type MOSFET;
wherein a voltage amplitude of said control signal is higher than voltage amplitudes of a first power supply and a second power supply,
wherein said semiconductor integrated circuit is in active mode when said control signal has a first voltage amplitude and is in standby mode when said control signal has a second voltage amplitude which is different from said first voltage amplitude, and
wherein in said active mode, said control signal comprises a clock signal and in said standby mode, said control signal comprises a signal for creating an information hold condition, a control signal generating circuit for generating said control signal, and a power supply voltage stepdown circuit which inputs said first power supply and outputs said second power supply at a lower voltage than said first power supply, wherein said control signal generating circuit is connected to said first power supply and said latch circuit is connected to said second power supply.

8. A semiconductor integrated circuit claimed in claim 7, wherein said first conductivity type MOSFET comprises an N-channel MOSFET and said second conductivity type MOSFET comprises a P-channel MOSFET, and wherein a high level voltage of said control signal is higher than high level voltages of said first power supply and said second power supply.

9. A semiconductor integrated circuit claimed in claim 7, wherein said first conductivity type MOSFET comprises a P-channel MOSFET and said second conductivity type MOSFET comprises an N-channel MOSFET, and wherein a low level voltage of said control signal is lower than low level voltages of said first power supply and said second power supply.

10. A latch circuit in a semiconductor integrated circuit having an active mode and a standby mode, based on a first control signal, said latch circuit comprising:

a first inverter circuit for receiving an input signal;

a first conductivity type MOSFET having a first threshold and having a first terminal connected to a first power supply and a second terminal connected to said first inverter circuit;

a second conductivity type MOSFET having a second threshold higher than said first threshold and having a first terminal connected to a second power supply having a lower voltage than said first power supply and a second terminal connected to said first inverter circuit;

an information hold loop for receiving an output from said first inverter circuit and holding information in said standby mode, said information hold loop comprising second and third inverter circuits, each having a first power terminal connected to said first power supply and a second power terminal connected to said second power supply; and a control signal generating circuit for receiving a clock signal and said first control signal, and for outputting a second control signal which is input to said first conductivity type MOSFET and a third control signal which is input to said second conductivity type MOSFET, wherein a low level voltage amplitude of said first control signal is lower than low level voltage amplitudes of said first power supply and said second power supply.

11. A latch circuit claimed in claim 10, wherein said semiconductor integrated circuit is in active mode when said control signal has a first voltage amplitude and is in standby mode when said control signal has a second voltage amplitude which is different from said first voltage amplitude.

12. A latch circuit claimed in claim 11, wherein in said active mode, said first control signal comprises a clock signal and in said standby mode, said first control signal comprises a signal for creating an information hold condition.

13. A latch circuit claimed in claim 12, wherein said first conductivity type MOSFET comprises a P-channel MOS-FET and said second conductivity type MOSFET comprises an N-channel MOSFET.

14. A latch circuit claimed in claim 11, wherein during an information fetching period of said active mode, said first control signal is at a low level and said second control signal is at a high level, such that said first inverter circuit generates an inverted input signal, and wherein during a standby mode and an information holding period of said active mode, said first control signal is at a high level and said second control signal is at a low level, such that said first conductivity type MOSFET and said second conductivity type MOSFET are in an off condition and information fetched during a preceding information fetching period is held in said information hold loop.

15. A semiconductor integrated circuit having an active mode and a standby mode, based on a first control signal, comprising:

a latch circuit comprising:

a first inverter circuit for receiving an input signal;

a first conductivity type MOSFET having a first threshold and having a first terminal connected to a first power supply and a second terminal connected to said first inverter circuit;

a second conductivity type MOSFET having a second threshold higher than said first threshold and having a first terminal connected to a second power supply having a lower voltage than said first power supply and a second terminal connected to said first inverter circuit; and an information hold loop for receiving an output from said first inverter circuit and holding information in said standby mode, said information hold loop comprising second and third inverter circuits, each having a first power terminal connected to said first power supply and a second power terminal connected to said second power supply, a control signal generating circuit, for inputting a clock signal and said first control signal and outputting a second control signal which is input to said first conductivity type MOSFET and a third control signal which is input to said second conductivity type MOS-FET;

wherein a low level voltage amplitude of said first control signal is lower than low level voltage amplitudes of said first power supply and said second power supply, and a logic circuit for generating said input signal.

16. A semiconductor integrated circuit claimed in claim 15, wherein said semiconductor integrated circuit is in active mode when said first control signal has a first voltage amplitude and is in standby mode when said first control signal has a second voltage amplitude which is different from said first voltage amplitude.

17. A semiconductor integrated circuit claimed in claim 16, wherein in said active mode, said first control signal comprises a clock signal and in said standby mode, said first control signal comprises a signal for creating an information hold condition.

* * * * *